US010340931B1

(12) United States Patent
Cheren et al.

(10) Patent No.: US 10,340,931 B1
(45) Date of Patent: Jul. 2, 2019

(54) DYNAMIC DELAY ADJUSTMENT FOR MULTI-CHANNEL DIGITAL-TO-ANALOG CONVERTER SYNCHRONIZATION

(71) Applicant: Tektronix, Inc., Beaverton, OR (US)

(72) Inventors: Geoffrey D. Cheren, Beaverton, OR (US); Jordan Edgar, Tigard, OR (US); Brett Trevor, Tigard, OR (US); Brandon Z. Fry, Aloha, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/859,434

(22) Filed: Dec. 30, 2017

(51) Int. Cl.
*H03M 1/06* (2006.01)

(52) U.S. Cl.
CPC ................... *H03M 1/0624* (2013.01)

(58) Field of Classification Search
CPC ............ H03K 5/1565; H03K 5/15013; H03M 1/0624
USPC ................... 341/120; 327/175, 276
See application file for complete search history.

(56) References Cited

U.S. PATENT DOCUMENTS

| | | | | |
|---|---|---|---|---|
| 4,804,938 A | * | 2/1989 | Rouse | H02J 3/14 307/11 |
| 5,118,975 A | * | 6/1992 | Hillis | G06F 1/10 327/12 |
| 5,627,862 A | * | 5/1997 | Mito | H04L 27/2332 329/304 |
| 5,768,283 A | * | 6/1998 | Chaney | H04L 7/0338 370/395.62 |
| 5,987,078 A | * | 11/1999 | Kiyanagi | H04L 27/0014 329/302 |
| 2002/0140478 A1 | * | 10/2002 | Fletcher | H03K 5/15013 327/175 |
| 2004/0155690 A1 | * | 8/2004 | Andrews | H03L 7/0814 327/276 |
| 2009/0289730 A1 | * | 11/2009 | Kawamura | H03D 13/003 331/1 A |
| 2010/0245160 A1 | * | 9/2010 | Sakurai | G01S 7/4008 342/200 |
| 2015/0288373 A1 | * | 10/2015 | Laquai | H03M 1/1071 341/120 |
| 2016/0134672 A1 | * | 5/2016 | Lotfallah | H04L 65/60 709/231 |

* cited by examiner

*Primary Examiner* — Lam T Mai
(74) *Attorney, Agent, or Firm* — Miller Nash Graham & Dunn; Andrew J. Harrington

(57) ABSTRACT

An arbitrary waveform generator including a first processor configured to output first digital data, a second processor configured to output second digital data, a first digital-to-analog converter to receive the first digital data from the first processor and output a first analog signal representing the first digital data, a second digital-to-analog converter to receive the second digital data from the second processor and output a second analog signal representing the second digital data, a system phase detector to receive the first analog signal and the second analog signal and determine a phase difference between the first analog signal and the second analog signal, and a controller configured to receive the phase difference from the system phase detector and determine a delay time for the first processor to delay an output of third digital data based on the phase difference.

20 Claims, 3 Drawing Sheets

DYNAMIC DELAY ADJUSTMENT FOR MULTI-CHANNEL DIGITAL-TO-ANALOG CONVERTER SYNCHRONIZATION

FIELD OF THE INVENTION

This disclosure is directed to systems and methods related to test and measurement systems, and in particular, to synchronizing multiple channels of an arbitrary waveform generator.

BACKGROUND

In an arbitrary waveform generator, when utilizing a digital-to-analog converter (DAC) that has a non-deterministic output in relation to its reference clock and/or a DAC clock, the outputs of each of the multiple channels may be skewed as a variable combination of DAC clock cycles and reference clock cycles. As a result, the arbitrary waveform generator cannot synchronize across multiple channels using traditional de-skew calibration methods.

Multiple arbitrary waveform generators may be used, along with a synchronization hub, to synchronize an output of one arbitrary waveform generator with an output of another arbitrary waveform generator to combat this issue. However, multiple arbitrary waveform generators, as well as a synchronization hub, must be used which can be costly as well as cumbersome to a user.

This disclosure addresses these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

In general, embodiments of the disclosure relate to an arbitrary waveform generator, having a first processor to delay an output of first digital data by a delay time and a second processor to output second digital data. Each of the first processor and the second processor are connected to a respective DAC to output an analog signal. A system phase detector receives the analog signals and determines a phase difference between the analog signals. A controller uses this phase difference to determine a delay time for the first processor to delay an output of the digital signal to align and synchronize the analog outputs from the DACs.

Figure 1:
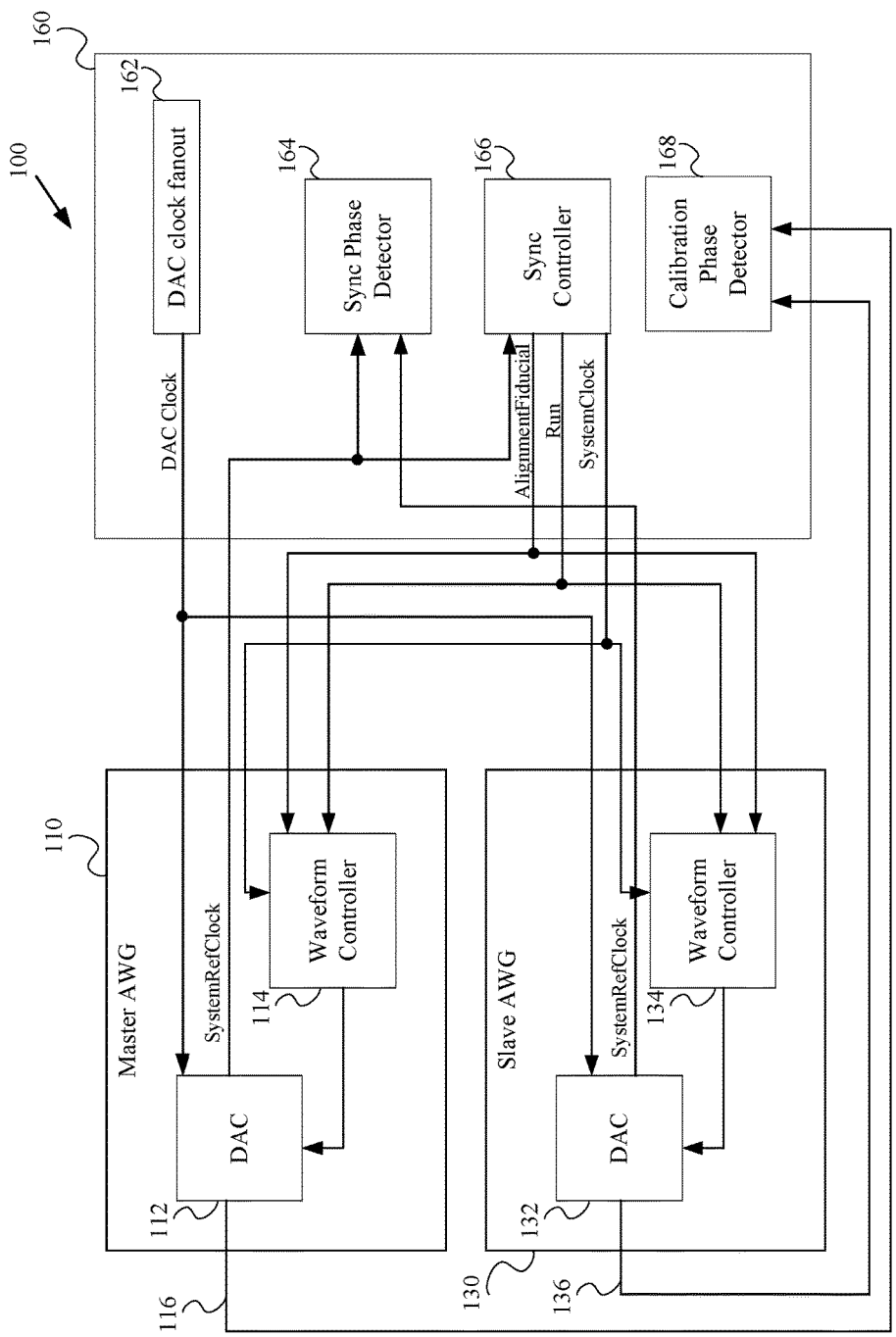
FIG. 1 is a block diagram of a conventional multiple arbitrary waveform generator system.

FIG. 1 illustrates a block diagram of a conventional multiple arbitrary waveform generator system 100 to align outputs from the arbitrary waveform generators. In FIG. 1, two arbitrary waveform generators 110 and 130 are shown. A master arbitrary waveform generator 110 controls the system 100 synchronization and arbitrary waveform generator 130 is set as a slave instrument. The synchronization process compares everything to the master arbitrary waveform generator 110 clocks. That is, an output of a slave arbitrary waveform generator 130 can be synchronized with the master arbitrary waveform generator 110.

A synchronization hub, or sync hub 160, distributes a DAC clock via DAC Clock Fanout 162 that feeds the digital-to-analog converters (DACs) 112, 132 that are present within each arbitrary waveform generator 110, 130. The source of this clock can be generated from the master arbitrary waveform generator 110 or an external signal generator (not shown). The DACs 112, 132, generate a divided down clock which is referred to and illustrated as the SystemRefClock. The SystemRefClock from the master and slave(s) arbitrary waveform generators 110, 130 feeds back into a sync hub sync phase detector 164 for use in the synchronization process. The master SystemRefClock is also fed into the hub sync controller 166 which distributes a derived clock from the master SystemRefClock. The SystemRefClock is fed into phase-locked loops (PLL) and the output of the PLL is distributed as the system clock to the system. This derived clock is referred to in FIG. 1 as the SystemClock.

The SystemClock is distributed to each arbitrary waveform generator 110, 130 in the system 100. The SystemClock is used to clock AlignmentFiducial signals and Run signals to the waveform controllers 114, 134 of each arbitrary waveform generator 110, 130, which are used to indicate to each instrument when to start generating waveforms. There is a second phase detector circuit called a calibration phase detector 168 in the sync hub 160 that is used with the analog output 116, 136 of each arbitrary waveform generator 110, 130 to calibrate the sync phase detector 164 over its operating frequency range.

Embodiments of the disclosure, as discussed in more detail below, remove the variable behavior of the non-deterministic DAC by routing the output signals of each of the channels to a common system phase detector circuit to align the channels. As such, multiple channels within a single arbitrary waveform generator may be aligned. A combination of coarse and fine adjustments may be used to synchronize the outputs deterministically.

Figure 2:
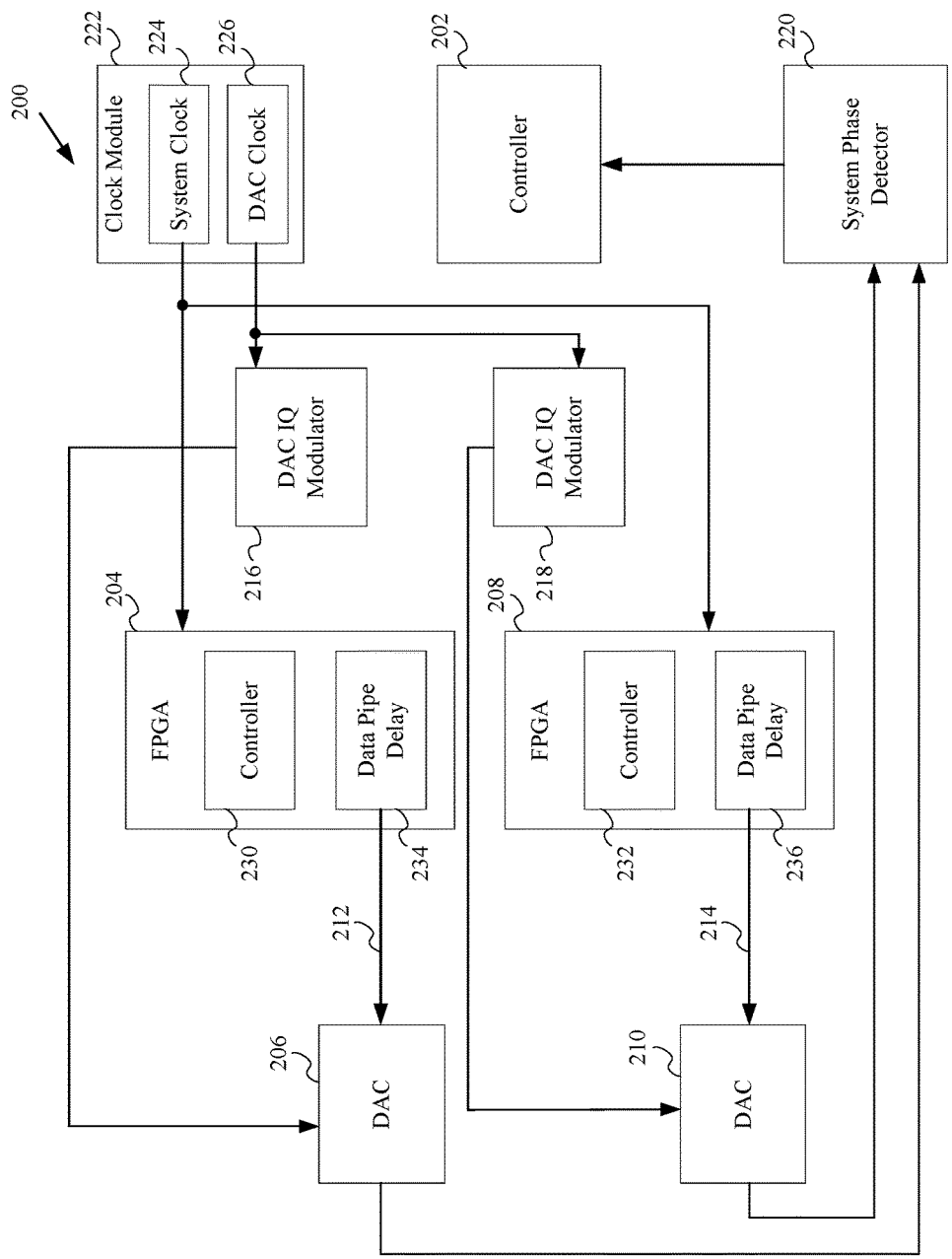
FIG. 2 is a block diagram of an arbitrary waveform generator according to embodiments of the disclosure.

FIG. 2 illustrates a block diagram of an arbitrary waveform generator 200 having multiple output channels. Embodiments of the disclosure, as described with respect to FIGS. 2 and 3, allow synchronization of multiple channels within a single arbitrary waveform generator when using a DAC that has a non-deterministic output.

Each channel of the arbitrary waveform generator 200 outputs an analog signal, as determined by a controller 202 of the arbitrary waveform generator 200. Each channel is associated with a field programmable gate array (FPGA) and a DAC. For example, FIG. 2 illustrates a two-channel arbitrary waveform generator 200. The arbitrary waveform generator includes a first FPGA 204 and a first DAC 206 associated with a first channel, and a second FPGA 208 and a second DAC 210 associated with a second channel. The first FPGA 204 and the first DAC 206 are connected via a serial data link 212. The second FPGA 208 and the second DAC 210 are also connected via a serial data link 214. The serial data link signals 212 and 214 may be, for example, JESD links.

The arbitrary waveform generator 200 also includes a DAC in-phase/quadrature (IQ) modulator 216 and 218 associated with each channel and connected to a respective one of the first FPGA 204 and the second FPGA 208. A system phase detector 220 is connected to the outputs of both the first DAC 206 and the second DAC 210, as well as the controller 202. The controller 202 sends instructions, as discussed in more detail below, to each of the DAC IQ modulators 216 and 218 and the first and second FPGAs 204 and 208 to remove skew between the outputs of DACs 206 and 210. This allows the channels to be aligned and synchronized when using a DAC with a non-deterministic output.

A clock 222 may also be included within the arbitrary waveform generator 200. In some embodiments, the clock 222 may be external to the arbitrary waveform generator 200. The clock outputs a system clock signal 224 to the first FPGA 204 and the second FPGA 208 and a DAC clock signal 226 to each of the DAC IQ modulators 216 and 218.

The output from the system phase detector 220 is received at the controller 202. The controller 202 outputs a different control signal to each of the DAC IQ modulators 216 and 218, as well as the FPGA 204 controller 230 and the FPGA 208 controller 232. The FPGA 204 controller 230 and the FPGA 208 controller 232 each send control signals to delay an output signal from the respective FPGAs 204 and 208 to respective data pipe delays 234 and 236.

In operation, the controller 202 sends a command to each FPGA 204 and 208 to generate a waveform. Once the system has been synchronized and calibrated, at least one of or both of FPGA 204 and 208 is able to delay an output, via the data pipe delays 234 and 236, respectively, so that the outputs from each of the channel are aligned and synchronized. The synchronization process may be done during manufacturing or may be performed prior to generating waveforms of the arbitrary waveform generator 200.

Although only two DACs 206 and 210 are shown, as well as associated FPGAs 204 and 208, and DAC IQ modulators 216 and 218, for ease of discussion, embodiments of the disclosure are not limited to two channel outputs. Rather, the arbitrary waveform generator 200 may include more than two channel outputs, each channel output including an associated DAC, FPGA, and DAC IQ modulator.

Figure 3:
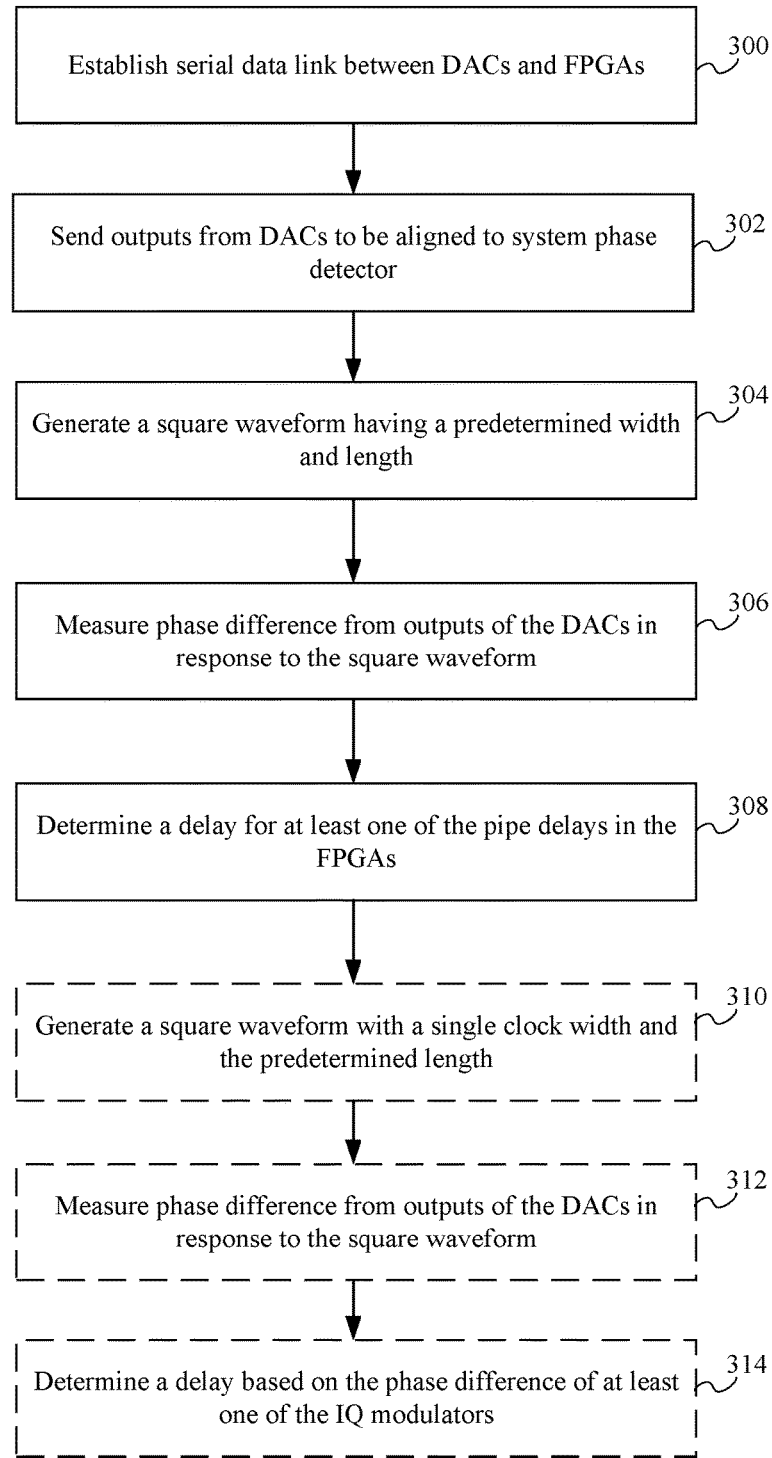
FIG. 3 is a flow chart of a method for synchronizing outputs of the arbitrary waveform generator of FIG. 2 according to embodiments of the disclosure.

The arbitrary waveform generator 200 may synchronize and align multiple channels in the arbitrary waveform generator 200 when the DACs 206 and 210 are non-deterministic. As mentioned above, the synchronization may be done during manufacturing of the arbitrary waveform generator or may be performed periodically during use of the arbitrary waveform generator. For example, the process may be performed each time the arbitrary waveform generator is turned on. FIG. 3 illustrates an example method for synchronizing the output of the DACs 206 and 210 based on the system clock signal.

Initially, a serial data link 212 and 214 is established 300 between a DAC 206 and 210 and a respective FPGA 204 and 208. The link may be for a non-deterministic latency where an output is plus or minus a combination of the system clock signal 224 and the DAC clock signal 226. The outputs from the channels being aligned are sent 302 to a common phase detector. In the example of FIG. 2, the outputs of DACs 206 and 210 are to be aligned and the outputs of DACs 206 and 210 are sent to system phase detector 220.

The controller 202 sends a signal for each of the FPGAs 204 and 208 to generate 304 a square waveform with a width of a set number of system clock 224 cycles and a length of a predetermined number of samples. For example, the width may be set to ten system clock 224 cycles and the length may be 2432 samples. However, both of the width and the length are merely examples and any number of clock cycles may be used as a width, as well as any number of samples may be used as a length of the square waveform.

After the square waveform is generated, an output from each of the DACs 206 and 210 is sent to the system phase detector 220 and a phase relationship between the outputs is measured 306. The phase relationship measurement is sent to controller 202 to determine 308 a delay for at least one of the pipe delays 234 and 236 in the FPGAs 204 and 208 to ensure the outputs of the DACs 206 and 210 are within one system clock 224 cycle of each other. The calculated delay for each of the pipe delays 234 and 236 is then sent to the FPGAs 204 and 208.

In some embodiments, a discrete adjustment may also be performed to align channel outputs. To determine an amount to rotate one or both of the IQ modulators 216 and 218, another square waveform with a width of a single system clock 224 cycle and the predetermined length is generated 310 through FPGAs 204 and 208 using the delay(s) determined by the controller 202. The phase relationship of the outputs of the DACs 206 and 210 is measured 312 based off the generated 310 square waveform. The controller 202 then determines 314 and sends a delay to each of the IQ modulators 216 and 218 to rotate the DAC clock signal 226 to fully synchronize the DACs 206 and 210 outputs.

Prior to aligning the outputs, as discussed in FIG. 3, the system phase detector 220 may be calibrated. The system phase detector 220 may be calibrated by measuring an output of the DACs 206 and 210 with an oscilloscope and de-skewing the outputs by rotating the IQ modulators 216 and 218 to each respective DAC 206 and 210. Once the outputs are aligned, the system phase detector 220 voltages are measured and stored within a memory (not shown) of the arbitrary waveform generator. These values are used for comparison during the alignment process, as discussed above with respect to FIG. 3.

Once the channels of the arbitrary waveform generator have been synchronized and aligned, then the controller 202 may output instructions to each of the FPGAs 204 and 208 to generate waveforms and at least one of the FPGAs 204 and 208 will delay the output by a delay time determined during the synchronization process of FIG. 3 so that the outputs of the channels of the arbitrary waveform generator are synchronized and aligned.

As mentioned above, although FIG. 2 and FIG. 3 discuss only a two-channel arbitrary waveform generator, an arbitrary waveform generator having any number of channels may use the above process for each channel to synchronize, as desired by a user.

Aspects and examples of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

The disclosed aspects and examples may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Aspects and examples of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described regarding a particular aspect, such feature, structure, or characteristic can be employed in connection with another disclosed aspect whether or not such feature is explicitly described in conjunction with such other disclosed aspect.

EXAMPLES

Illustrative examples of the technologies disclosed herein are provided below. An embodiment of the technologies may include any one or more, and any combination of, the examples described below.

Example 1 is an arbitrary waveform generator, comprising a first processor configured to output first digital data; a second processor configured to output second digital data; a first digital-to-analog converter to receive the first digital data from the first processor and output a first analog signal representing the first digital data; a second digital-to-analog converter to receive the second digital data from the second processor and output a second analog signal representing the second digital data; a system phase detector to receive the first analog signal and the second analog signal and determine a phase difference between the first analog signal and the second analog signal; and a controller configured to receive the phase difference from the system phase detector and determine a delay time for the first processor to delay an output of third digital data based on the phase difference.

Example 2 is the arbitrary waveform generator of example 1, wherein the controller is further configured to determine the delay time as a multiple of a system clock.

Example 3 is arbitrary waveform generator of either example 1 or 2, wherein the first processor includes a data pipe delay and the first processor is further configured to delay the output of the third digital data through the data pipe delay based on the delay time.

Example 4 is arbitrary waveform generator of any one of examples 1-3, wherein the delay time is a first delay time and the controller is further configured to determine a second delay time for the second processor to delay an output of fourth digital data based on the phase difference.

Example 5 is the arbitrary waveform generator of example 4, wherein the first processor includes a first data pipe delay and the first processor is further configured to delay the output of the third digital data through the data pipe delay based on the delay time, and wherein the second processor includes a second data pipe delay and the second processor is further configured to delay the output of the fourth digital data through the data pipe delay based on the second delay time.

Example 6 is the arbitrary waveform generator of any one of examples 1-5, wherein each of the first processor and the second processor is a field programmable gate array.

Example 7 is the arbitrary waveform generator of any one of examples 1-6, wherein the first digital data and the second digital each represent a square waveform having a predetermined width and length.

Example 8 is the arbitrary waveform generator of any one of examples 1-7, further comprising a first in-phase/quadrature (IQ) modulator to rotate a clock of the first digital-to-analog converter based on a signal from the controller and a second IQ modulator to rotate a clock of the second digital-to-analog converter based on a signal from the controller.

Examples 9 is a method for synchronyzing channel outputs in a multi-channel arbitrary waveform generator, comprising generating first digital data by a first processor; generating second digital data by a second processor; receiving the first digital data at a first digital-to-analog converter from the first processor; generating a first analog signal representing the first digital data; receiving the second digital data at a second digital-to-analog converter from the second processor; generating a second analog signal representing the second digital data; determining a phase difference between the first analog signal and the second analog signal; and determining a delay time for the first processor to delay an output of third digital data based on the phase difference.

Example 10 is the method of example 9, wherein the delay time is determined as a multiple of a system clock.

Example 11 is the method of either one of examples 9 and 10, further comprising delaying an output of the third digital data by the first processor based on the delay time.

Example 12 is the method of any one of examples 9-11, wherein the delay time is a first delay time and the method further comprises determining a second delay time for the second processor to delay an output of fourth digital data based on the phase difference.

Example 13 is the method of example 12, further comprising delaying an output of the third digital data by the first processor based on the first delay time; and delaying an output of the fourth digital data by the second processor based on the second delay time.

Example 14 is the method of any one of examples 1-13, wherein each of the first processor and the second processor is a field programmable gate array.

Example 15 is the method of examples 1-14, wherein the first digital data and the second digital each represent a square waveform having a predetermined width and length.

Example 16 is the method of examples 1-15, further comprising rotating a clock of the first digital-to-analog converter based the phase difference.

Example 17 is a computer readable storage medium having instructions stored thereon that, when executed by a processor of an arbitrary waveform generator, cause the arbitrary waveform generator to generate first digital data by a first processor; generate second digital data by a second processor; receive the first digital data at a first digital-to-analog converter from the first processor; generate a first analog signal representing the first digital data; receive the second digital data at a second digital-to-analog converter from the second processor; generate a second analog signal representing the second digital data; determine a phase difference between the first analog signal and the second analog signal; and determine a delay time for the first processor to delay an output of third digital data based on the phase difference.

Example 18 is the computer readable storage medium of example 17, wherein the delay time is determined as a multiple of a system clock.

Example 19 is the computer readable storage medium of either example 17 or 18, wherein instructions stored thereon further cause the arbitrary waveform generator to delay an output of the third digital data by the first processor based on the delay time.

Example 20 is the computer readable storage medium of any one of examples 17-19, wherein the delay time is a first delay time and the instructions stored thereon further cause the arbitrary waveform generator to determine a second delay time for the second processor to delay an output of fourth digital data based on the phase difference; delay an output of the third digital data by the first processor based on the first delay time; and delay an output of the fourth digital data by the second processor based on the second delay time.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. An arbitrary waveform generator, comprising:
   a first processor configured to output first digital data;
   a second processor configured to output second digital data;
   a first digital-to-analog converter to receive the first digital data from the first processor and output a first analog signal representing the first digital data;
   a second digital-to-analog converter to receive the second digital data from the second processor and output a second analog signal representing the second digital data;
   a system phase detector to receive the first analog signal and the second analog signal and determine a phase difference between the first analog signal and the second analog signal; and
   a controller configured to receive the phase difference from the system phase detector and determine a delay time for the first processor to delay an output of third digital data based on the phase difference.

2. The arbitrary waveform generator of claim 1, wherein the controller is further configured to determine the delay time as a multiple of a system clock.

3. The arbitrary waveform generator of claim 1, wherein the first processor includes a data pipe delay and the first processor is further configured to delay the output of the third digital data through the data pipe delay based on the delay time.

4. The arbitrary waveform generator of claim 1, wherein the delay time is a first delay time and the controller is further configured to determine a second delay time for the second processor to delay an output of fourth digital data based on the phase difference.

5. The arbitrary waveform generator of claim 4, wherein the first processor includes a first data pipe delay and the first processor is further configured to delay the output of the third digital data through the data pipe delay based on the delay time, and
wherein the second processor includes a second data pipe delay and the second processor is further configured to delay the output of the fourth digital data through the data pipe delay based on the second delay time.

6. The arbitrary waveform generator of claim 1, wherein each of the first processor and the second processor is a field programmable gate array.

7. The arbitrary waveform generator of claim 1, wherein the first digital data and the second digital each represent a square waveform having a predetermined width and length.

8. The arbitrary waveform generator of claim 1, further comprising a first in-phase/quadrature (IQ) modulator to rotate a clock of the first digital-to-analog converter based on a signal from the controller and a second IQ modulator to rotate a clock of the second digital-to-analog converter based on a signal from the controller.

9. A method for synchronizing channel outputs in the arbitrary waveform generator of claim 1, the method comprising:
- generating first digital data by the first processor;
- generating second digital data by the second processor;
- receiving the first digital data at the first digital-to-analog converter from the first processor;
- generating a first analog signal representing the first digital data;
- receiving the second digital data at the second digital-to-analog converter from the second processor;
- generating a second analog signal representing the second digital data;
- determining, by the system phase detector, a phase difference between the first analog signal and the second analog signal; and
- determining, by the controller, a delay time for the first processor to delay an output of third digital data based on the phase difference.

10. The method of claim 9, wherein the delay time is determined as a multiple of a system clock.

11. The method of claim 9, further comprising delaying an output of the third digital data by the first processor based on the delay time.

12. The method of claim 9, wherein the delay time is a first delay time and the method further comprises determining a second delay time for the second processor to delay an output of fourth digital data based on the phase difference.

13. The method of claim 12, further comprising:
- delaying an output of the third digital data by the first processor based on the first delay time; and
- delaying an output of the fourth digital data by the second processor based on the second delay time.

14. The method of claim 9, wherein each of the first processor and the second processor is a field programmable gate array.

15. The method of claim 9, wherein the first digital data and the second digital each represent a square waveform having a predetermined width and length.

16. The method of claim 9, further comprising rotating a clock of the first digital-to-analog converter based the phase difference.

17. A non-transitory computer readable storage medium having instructions stored thereon that, when executed by a processor of an arbitrary waveform generator, cause the arbitrary waveform generator to:
- generate first digital data by a first processor;
- generate second digital data by a second processor;
- receive the first digital data at a first digital-to-analog converter from the first processor;
- generate a first analog signal representing the first digital data;
- receive the second digital data at a second digital-to-analog converter from the second processor;
- generate a second analog signal representing the second digital data;
- determine a phase difference between the first analog signal and the second analog signal; and
- determine a delay time for the first processor to delay an output of third digital data based on the phase difference.

18. The non-transitory computer readable storage medium of claim 17, wherein the delay time is determined as a multiple of a system clock.

19. The non-transitory computer readable storage medium of claim 17, wherein instructions stored thereon further cause the arbitrary waveform generator to delay an output of the third digital data by the first processor based on the delay time.

20. The non-transitory computer readable storage medium of claim 17, wherein the delay time is a first delay time and the instructions stored thereon further cause the arbitrary waveform generator to:
- determine a second delay time for the second processor to delay an output of fourth digital data based on the phase difference;
- delay an output of the third digital data by the first processor based on the first delay time; and
- delay an output of the fourth digital data by the second processor based on the second delay time.

* * * * *